United States Patent
Lee et al.

(10) Patent No.: US 8,822,841 B2
(45) Date of Patent: Sep. 2, 2014

(54) PACKAGE SUBSTRATE AND FABRICATING METHOD THEREOF

(75) Inventors: Dong Gyu Lee, Seoul (KR); Jin Won Choi, Gyeonggi-do (KR); Sung Won Jeong, Gyeongsangnam-do (KR); Dae Young Lee, Gyeonggi-do (KR); Gi Sub Lee, Busan (KR); Jin Ho Kim, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 94 days.

(21) Appl. No.: 13/411,168

(22) Filed: Mar. 2, 2012

(65) Prior Publication Data

US 2012/0267285 A1     Oct. 25, 2012

(30) Foreign Application Priority Data

Apr. 25, 2011 (KR) .................. 10-2011-0038602

(51) Int. Cl.
*H05K 1/11* (2006.01)
*H01K 3/10* (2006.01)

(52) U.S. Cl.
USPC ........................................... 174/264; 29/852

(58) Field of Classification Search
USPC .................... 174/262–266; 361/792–795; 29/852–853
See application file for complete search history.

(56) References Cited

U.S. PATENT DOCUMENTS

2001/0054513 A1* 12/2001 Asai et al. .............. 174/263

FOREIGN PATENT DOCUMENTS

| JP | 2006066522 | 3/2006 |
|---|---|---|
| JP | 2008098210 | 4/2008 |
| JP | 2010-518637 A | 5/2010 |
| KR | 2007-0104919 A | 10/2007 |
| KR | 10-2008-0020365 A | 3/2008 |
| KR | 10-2010-0060968 A | 6/2010 |
| KR | 2011-0036450 A | 4/2011 |
| KR | 2011-0064470 A | 6/2011 |
| KR | 2011-0064471 A | 6/2011 |

OTHER PUBLICATIONS

Korean Notice of Allowance for Application No. 10-2011-0038602 dated Jul. 12, 2012.
Japanese Office Action for Application No. 2012-088255 dated Mar. 19, 2013.
Japanese Office Action issued in Japanese Application No. 2013-149296 dated May 7, 2014.
Taiwan Office Action issued in Application No. 101106780 dated Feb. 20, 2014.

* cited by examiner

*Primary Examiner* — Jeremy C Norris
(74) *Attorney, Agent, or Firm* — McDermott Will & Emery LLP (57) ABSTRACT

Disclosed herein are a package substrate and a fabricating method thereof. The package substrate includes a substrate including at least one conductive pad, an insulation layer formed on the substrate and including an opening through which the conductive pad is exposed, a blister prevention layer formed along a top surface of the conductive pad exposed through the opening and a sidewall of the insulation layer, a metal post made of at least one alloy material and formed on the blister prevention layer, and a heat-diffusion prevention film formed on the metal post.

12 Claims, 7 Drawing Sheets

PACKAGE SUBSTRATE AND FABRICATING METHOD THEREOF

CROSS REFERENCE(S) TO RELATED APPLICATIONS

This application claims the benefit under 35 U.S.C. Section 119 of Korean Patent Application Serial No. 10-2011-0038602, entitled "Package Substrate and Fabricating Method Thereof" filed on Apr. 25, 2011, which is hereby incorporated by reference in its entirety into this application.

BACKGROUND OF THE INVENTION

1. Technical Field

The present invention relates to a package substrate and a fabricating method thereof, and more particularly, to a package substrate in which a metal post is made of a metal alloy and a heat-diffusion prevention film is formed on the metal post, and a fabricating method thereof.

2. Description of the Related Art

In general, a flip chip package has a structure that accesses a chip using a solder bump formed on a substrate. Since such a flip chip package aims at processing huge data at high speed, there is a trend of making a bump pitch smaller according to an increase in a data capacity to be processed including a current trend toward light, slim, short, and small semiconductors.

A change in the package caused by this trend causes a problem that bump reliability attenuates and thus a solution to this problem is urgently needed.

In order to improve reliability of bump access between the substrate and the chip, it has been suggested in the related art that solder, which is a bump material of the chip, is substituted with copper because mechanical strength is relatively higher and stable, and that a bump of the substrate is formed with a copper post.

In this case, solder is used as a medium for bonding the copper formed on the chip and the substrate, and in general, the solder is printed or plated for use on the copper poster formed on the substrate.

However, the related-art solder bump formed on the copper post has several problems in that a warpage phenomenon may occur between the substrate and the chip since the copper post easily oxidizes and its hardness is strong because of properties of copper, and accordingly, a short circuit phenomenon may occur on the copper post, if a crack appears on the copper post or warpage becomes more serious.

In order to solve these problems, the copper post is now substituted with various metal alloy materials. However, if the post is made of a metal alloy material, there is a problem in that a blister phenomenon occurs on a dry film between a metal seed layer and the dry film, and also, a problem that a plating layer is formed on an insulation layer on which a plating layer should not be formed or plating is not achieved on a pad on which a plating layer should be formed.

Also, if a reflow process is performed after the solder has been plated or printed on the copper post made of the metal alloy material, a boundary surface between the copper post and the solder disappears and thus the solder may flow to a top surface or a side surface of the copper post or the copper post may melt due to high temperature heat transmitted from the solder during the reflow process.

SUMMARY OF THE INVENTION

An object of the present invention is to provide a package substrate in which a metal post is made of a metal alloy and a heat-diffusion prevention film is formed on the metal post, so that a blister phenomenon is prevented from occurring on a dry film and the metal post is prevented from melting during a reflow process, and a fabricating method thereof.

According to an exemplary embodiment of the present invention, there is provided a package substrate including: a substrate including at least one conductive pad, an insulation layer formed on the substrate and including an opening through which the conductive pad is exposed, a blister prevention layer formed along a top surface of the conductive pad exposed through the opening and a sidewall of the insulation layer, a metal post made of at least one alloy material and formed on the blister prevention layer, and a heat-diffusion prevention film formed on the metal post.

The package substrate may further include a solder bump formed on the heat-diffusion prevention film.

The blister prevention layer may be formed higher than a top surface of the insulation layer on which the opening is formed and may be formed by electro copper plating using copper (Cu).

The blister prevention layer may be made of an alloy of copper (Cu) and tin (Sn) and a copper content of the blister prevention layer may be 0.8 wt % to 5 wt %.

The heat-diffusion prevention film may be made of a metal material selected from the group consisting of Au—Ni, Au—Ni alloy, Ni, Ni alloy, Pd—Ni, Pd—Ni alloy, Au—Pd—Ni, and Au—Pd—Ni alloy.

According to another exemplary embodiment of the present invention, there is provided a method for fabricating a package substrate, the method including: preparing a substrate which includes at least one conductive pad, forming an insulation layer on the substrate, the insulation layer including an opening through which the conductive pad is exposed, forming a blister prevention layer along a top surface of the conductive pad exposed through the opening and a sidewall of the insulation layer, forming a metal post on the blister prevention layer by electro plating, and forming a heat-diffusion prevention film on the metal post by electro or electroless plating.

The method may further include, after the forming of the heat-diffusion prevention film, forming a solder bump on the heat-diffusion prevention film.

The method may further include, before the forming of the blister prevention layer, forming a plating seed layer on the insulation layer, and forming a dry film pattern on the plating seed layer.

The blister prevention layer may be formed higher than a top surface of the insulation layer so as to block an interface between the dry film pattern and the plating seed layer.

The blister prevention layer may be formed by electro plating using the plating seed layer as an electrode, and may be made of an alloy material of tin (Sn) and copper (Cu) and a copper content of the blister prevention layer may be 0.8 wt % to 5 wt %.

The heat-diffusion prevention film may be made of a metal material selected from the group consisting of Au—Ni, Au—Ni alloy, Ni, Ni alloy, Pd—Ni, Pd—Ni alloy, Au—Pd—Ni, and Au—Pd—Ni alloy.

The method may further include, after the forming of the solder bump on the heat-diffusion prevention film, removing the dry film pattern enclosing the metal post, the heat-diffusion prevention film, and the solder bump, and removing the plating seed layer formed on a lower surface of the dry film pattern.

DESCRIPTION OF THE PREFERRED EMBODIMENTS

The technical configuration and acting effects of a package substrate and a fabricating method thereof according to the present invention will be clearly understood by the following detailed description with reference to the accompanying drawings.

Figure 1:
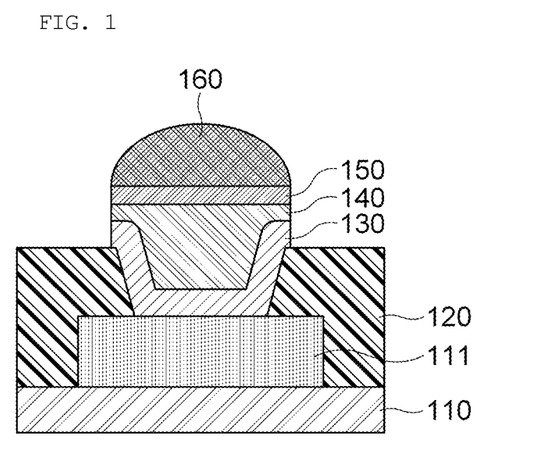
FIG. 1 is a cross-sectional view of a package substrate according to an exemplary embodiment.

FIG. 1 is a cross-sectional view of a package substrate according to an exemplary embodiment. As shown in FIG. 1, a package substrate 100 according to an exemplary embodiment includes a substrate 110 on which a conductive pad 111 is formed, an insulation layer 120 formed on the substrate 110, a blister prevention layer 130 formed on the conductive pad 111 and the insulation layer 120, a metal post 140 formed on the blister prevention layer 130, a heat-diffusion prevention film 150 formed on a top surface of the metal post 140, and a solder bump 160 formed on the heat-diffusion prevention film 150.

The insulation layer 120 may include an opening 121 through which the conductive pad 111 is exposed, and the blister prevention layer 130 may be formed along a top surface of the conductive pad 111, which is exposed through the opening 121 of the insulation layer 120, and a sidewall of the insulation layer 120 around the conductive pad 111.

The blister prevention layer 130 may be formed higher than a top surface of the insulation layer 120 in which the opening 121 is formed, when being formed along the sidewall of the insulation layer 120. The blister prevention layer 130 may be formed in a cup shape corresponding to a shape of the opening 121 and the material may be formed by electro copper plating using copper (Cu).

Since the blister prevention layer 130 is formed higher than the top surface of the insulation layer 120, when the metal post 140 is formed on an upper portion of the blister prevention layer 130, a plating solution for forming the metal post 140 prevents interfacial encroachment between a dry film (not shown in FIG. 1, and see FIGS. 4E to 4H) and the insulation layer 120 so that the dry film can be prevented from being blistered. The blister prevention layer 130 may have a thickness of 5 to 10 μm.

A plating seed layer 125 may be formed on a lower portion of the blister prevention layer 130 before the blister prevention layer 130 is formed. The plating seed layer 125 may be formed by chemical copper plating by electroless plating or sputtering and serves as an electrode to allow the blister prevention layer 130 and the metal post 140 to be formed by electro plating. The plating seed layer 125 may have a thickness of 0.5 to 1.0 μm.

In this embodiment, the blister prevention layer 130 and the metal post 140 are generally formed by electro plating. However, the method for forming the blister prevention layer 130 and the metal post 140 is not limited to the electro plating. The blister prevention layer 130 and the metal post 140 may be formed by electroless plating without forming the plating seed layer 125.

Also, the metal post 140 may be formed on the upper portion of the blister prevention layer 130 by electro plating. In this case, the metal post 140 may be made of an alloy of copper (Cu) and tin (Sn).

A copper content of the metal post 140 may be 0.8 wt % to 5 wt %. If the metal post 140 is made of the alloy of copper and tin, the metal post 140 has a soft property compared to a related-art metal post made of only copper, and thus, makes it possible to fabricate a package substrate capable of minimizing warpage of the substrate and deformation or breakage of the metal post.

The heat-diffusion prevention film 150, which is a barrier layer, may be formed on a top surface of the metal post 140 by electro or electroless plating. The solder bump 160 is formed on an upper portion of the heat-diffusion prevention film 150 so that the heat-diffusion prevention film 150 prevents the solder bump 160 from melting to the side and flowing down through the metal post 140 during a reflow process, and prevents the metal post 140 from melting by heat transmitted from the solder bump 160.

The solder bump 160 having a rounded upper portion may be formed on the upper portion of the heat-diffusion prevention film 150 by printing or plating solder and performing a reflow process.

Also, the heat-diffusion prevention film 150 prevents the metal post 140 from being oxidized and displays an effect of improving a wetting property of the solder bump 160 formed thereon.

The heat-diffusion prevention film 150 may be made of a metal material selected from the group consisting of Au—Ni, Au—Ni alloy, Ni, Ni alloy, Pd—Ni, Pd—Ni alloy, Au—Pd—Ni and Au—Pd—Ni alloy. The metal material selected to form the heat-diffusion prevention film 150 is combined with a Sn base material of the solder bumper 160 so that a $Ni_xSn_x$ base prevention film is formed. Therefore, the stable and uniform heat-diffusion prevention film 150 of 1 μm or less is formed and thus improves interfacial adhesion with the solder bump 160.

The solder bump 160 formed on the heat-diffusion prevention film 150 may be made of a material having a melting point lower than that of the metal post 140, such as an alloy of tin (Sn) and bismuth (Bi). This is to prevent the metal post 140 from melting during the reflow process because the reflow process is performed at a process temperature lower than the melting point of the solder bump 160, which is lower than that of the metal post 140.

However, since the reflow process temperature may not be stable and the solder bump 160 may flow down to the side of the metal post 140 or the metal post 140 repeatedly receiving high temperature heat from the solder bump 160 may melt, while passing through the reflow process three or more times in general according to a substrate sealing condition of a capacitor or a chip, the heat-diffusion prevention film 150 is essentially required.

Figure 2:
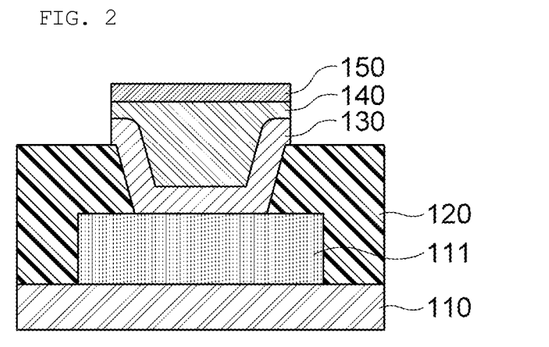
FIG. 2 is a cross-sectional view of a package substrate according to another exemplary embodiment.

FIG. 2 is a cross-sectional view of a package substrate according to another exemplary embodiment. As shown in FIG. 2, a package substrate according to another exemplary embodiment has the same configuration as that of the aforementioned exemplary embodiment, except that only the heat-diffusion prevention film 150 is formed on the metal post 140 formed on the substrate 110.

As the package substrate of this exemplary embodiment does not require a reflow process to form the solder bumper 160 on the heat-diffusion prevention film 150, the fabricating process can be simplified, and, as a high thermal resistance dry film (will be explained below) is not required when forming the metal post 140, a cost saving effect can be achieved.

Figure 3A:
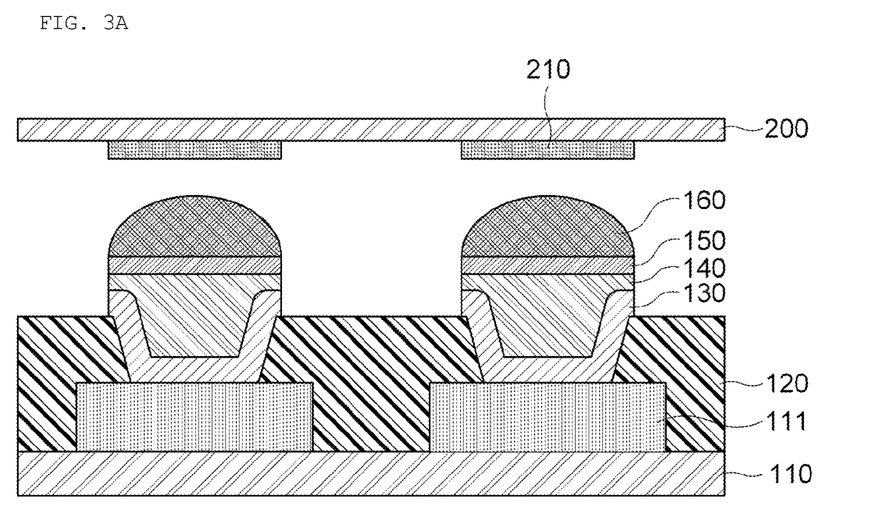
FIGS. 3A and 3B are views of a chip attachment structure according to exemplary embodiments.
Figure 3B:
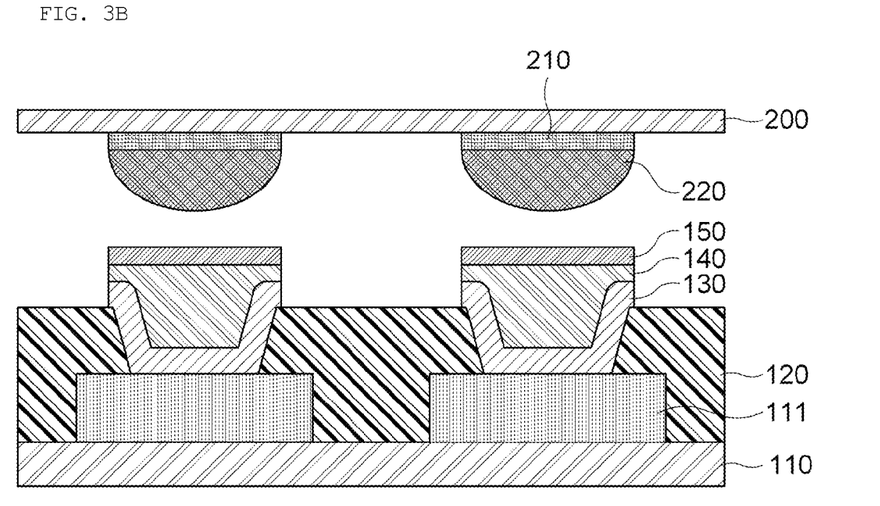

FIGS. 3A and 3B are views illustrating a chip attachment structure according to exemplary embodiments. As shown in FIGS. 3A and 3B, the chip attachment structure is different according to the embodiments of the package substrate. In other words, if a chip 200 is attached to the package substrate in which the solder bump 160 is formed on the heat-diffusion prevention film 150 as shown in FIG. 1, the package substrate goes through a reflow process in a state where a pad 210 formed on the chip 200 is directly in contact with the solder bumper 160. On the other hand, if the chip 200 is to be attached to the package substrate in which only the heat-diffusion prevention film 150 is formed as shown in FIG. 2, solder 220 is formed on the pad 210 of the chip 200 and the package substrate goes through a reflow process in a state where the heat-diffusion prevention film 150 is in contact with the solder 220, so that the chip 200 is sealed onto the package substrate.

A method for fabricating a package substrate according to an exemplary embodiment will be explained in detail with reference to FIGS. 4A to 4K.

FIGS. 4A to 4K are cross-sectional views illustrating a process of fabricating a package substrate in sequence according to an exemplary embodiment.

As shown in FIGS. 4A to 4K, the method for fabricating the package substrate according to an exemplary embodiment includes: preparing the substrate 110 including at least one conductive pad 111, forming the insulation layer 120 having the opening 121 through which the conductive pad 111 of the substrate 110 is exposed, forming the blister prevention layer 130 along the top surface of the conductive pad 111 exposed through the opening 121 and the sidewall of the insulation layer 120, forming the metal post 140 on the blister prevention layer 130 by electro plating, forming the heat-diffusion prevention film 150 on the metal post 140 by electro or electroless plating, and forming the solder bump 160 on the heat-diffusion prevention film 150.

Figure 4A:
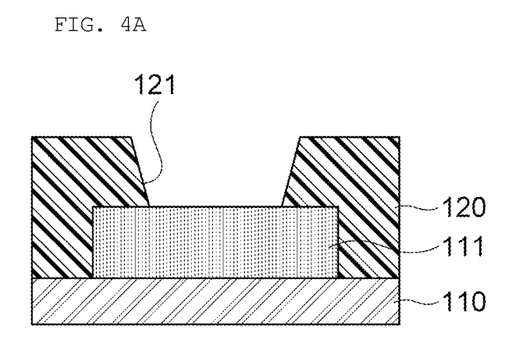
FIGS. 4A to 4K are cross-sectional views illustrating a process of fabricating a package substrate in sequence according to an exemplary embodiment.
Figure 4B:
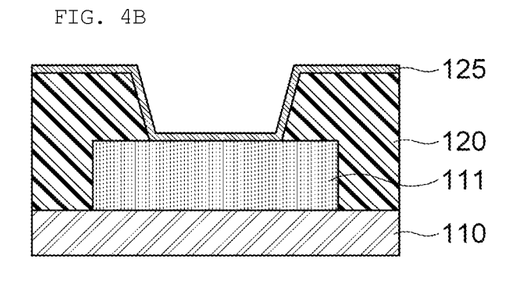
Figure 4C:
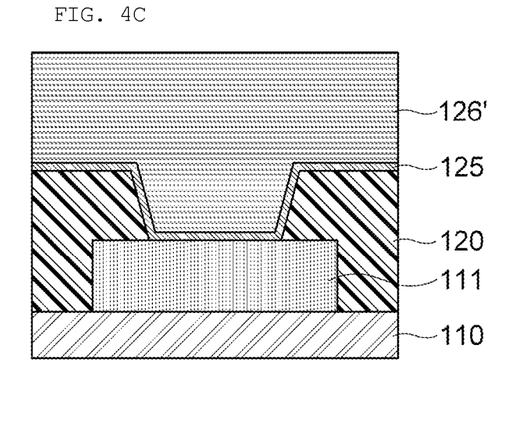

Referring to FIG. 4A, first, the insulation layer 120 having the opening 121 is formed on the substrate 110 including at least one conductive pad 111 such that the conductive pad 111 is exposed through the opening 121. The insulation layer 120 may be made of a photosensitive solder resist and may be formed by coating, scanning and developing the solder resist.

The plating seed layer 125 (see FIG. 4B) is formed on the insulation layer 120 including the opening 121. The plating seed layer 125 may be formed by chemical copper plating formed by electroless plating and may have a thickness of 0.5 to 1.0 μm. The plating seed layer 125 serves as an electrode to help the blister prevention layer 130 and the metal post 140 to be formed by electro plating.

Figure 4D:
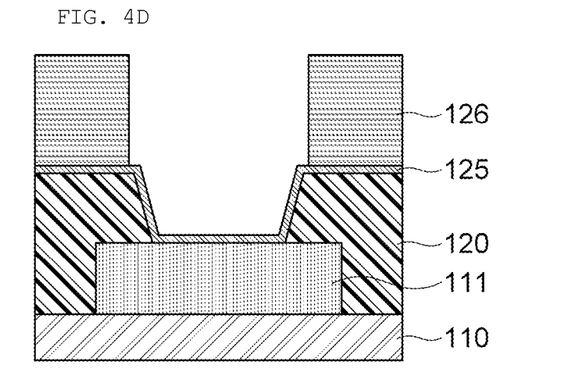

Next, a dry film resist 126' is formed on the plating seed layer 125 (see FIG. 4C), and a dry film pattern 126 is formed by scanning and developing the dry film resist 126' as shown in FIG. 4D.

Figure 4E:
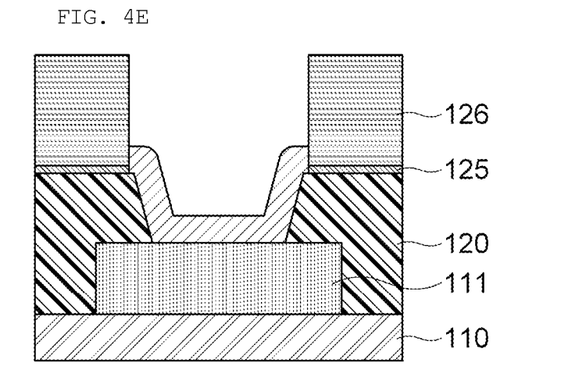

The blister prevention layer 130 is formed along the top surface of the conductive pad 111 in the opening 121 and the outer sidewall of the insulation layer 120 (see FIG. 4E). When the blister prevention layer 130 is formed along the sidewall of the insulation layer 120, the blister prevention layer 130 is formed higher than the top surface of the insulation layer 120 so that the blister prevention layer 130 can block an interface between the dry film pattern 126 and the plating seed layer 125.

Accordingly, a plating solution for forming the metal post 140 to be formed afterward is prevented from encroaching on the interface between the insulation layer 120 and the dry film pattern 126 and as a result, the dry film pattern 126 is prevented from being blistered while the plating solution is prevented from encroaching on the interface.

The blister prevention layer 130 may be formed in a cup shape corresponding to the shape of the opening 121, may be made of copper (Cu), and may have a thickness of 5 to 10 μm.

Also, the blister prevention layer 130 may be formed by electro plating using the plating seed layer 125 as an electrode.

Figure 4F:
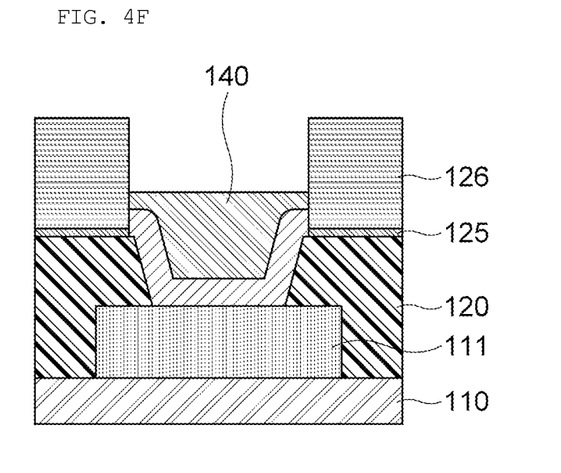

Next, referring to FIG. 4F, the metal post 140 is formed on the blister prevention layer 130. The metal post 140 may be formed by electro plating and may be made of an alloy material of tin (Sn) and copper (Cu). A copper content of the metal post 140 may be 0.8 wt % to 5 wt %.

When the electro plating for forming the metal post 140 is performed, current density (ASD) is lowered to 0.5 ASD(A/dm2) to 3 ASD(A/dm2) so that a grain size constituting the metal post 140 is reduced. This is to prevent a blister phenomenon on the dry film pattern 126 from becoming more serious as volume expansion occurs, if a grain size of the copper-tin constituting the metal post 140 increases.

Figure 4G:
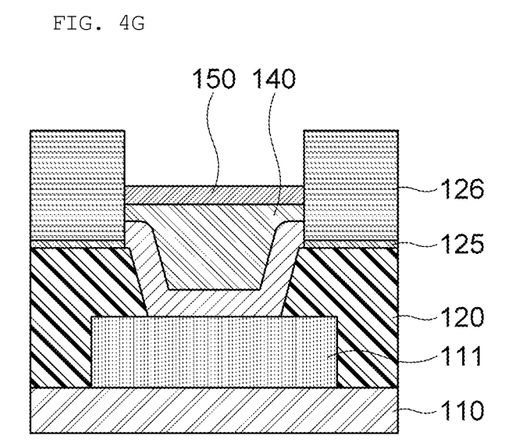
Figure 4H:
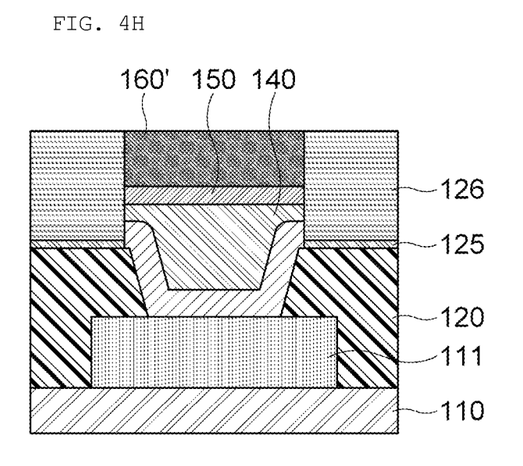

Also, if the metal post 140 is formed by electro plating, the heat-diffusion prevention film 150 of 1 μm or less may be formed on the top surface of the metal post 140 (see FIG. 4G). The heat-diffusion prevention film 150 is formed to prevent the solder bump 160 formed thereon from melting to the side and flowing down through the metal post 140 during the reflow process. The heat-diffusion prevention film 150 blocks heat transmitted from the solder bump 160 and prevents the metal post 140 from melting.

The heat-diffusion prevention film 150 may be made of a metal material selected from the group consisting of Au—Ni, Au—Ni alloy, Ni, Ni alloy, Pd—Ni, Pd—Ni alloy, Au—Pd—Ni, and Au—Pd—Ni alloy, and the stable and uniform heat-diffusion prevention film 150 of 1 μm or less is formed such that interfacial adhesion with the solder bump 160 is improved.

Figure 4I:
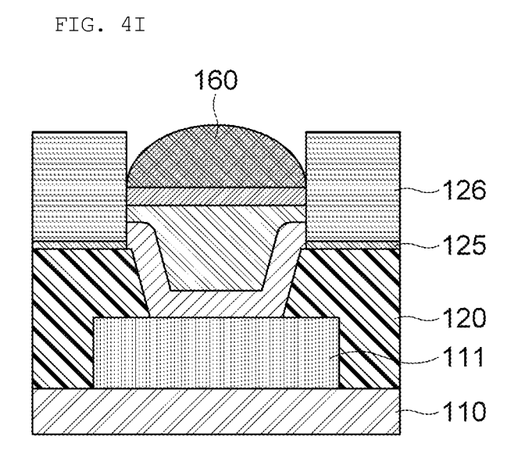
Figure 4J:
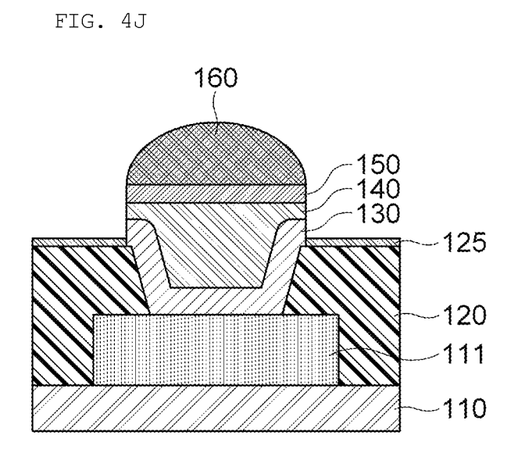
Figure 4K:
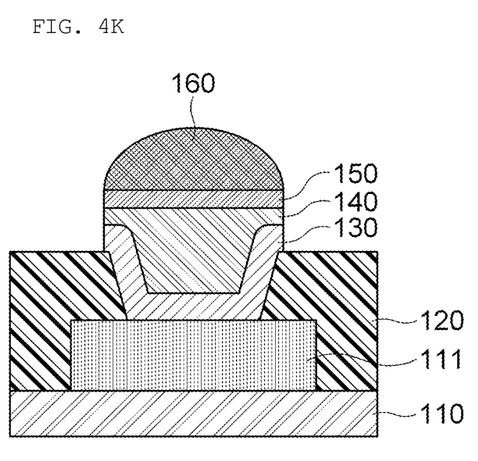

Next, a solder paste 160' is printed on the heat-diffusion prevention film 150 formed on the upper portion of the metal post 140 (see FIG. 4H), and the solder bump 160 is formed by performing the reflow process with respect to the solder past 160' (see FIG. 4I).

Finally, by removing the dry film pattern 126 enclosing the metal post 140, the heat-diffusion prevention film 150, and the solder bump 160 (see FIG. 4J) and removing the plating seed layer 125 formed on the lower surface of the dry film pattern 126 (see FIG. 4K), the package substrate, in which melting solder of the solder bump 160 does not flow down and the metal post 140 is prevented from melting due to the presence of the heat-diffusion prevention film 150, is completely fabricated.

In the package substrate and the fabricating method thereof according to the exemplary embodiment as described above, the heat-diffusion prevention film is formed on the top surface of the metal post and the solder bump is formed on the upper portion of the heat-diffusion prevention film, so that the solder bump is prevented from melting to the side and flowing down through the metal post during the reflow process, and the metal post is prevented from melting by heat transmitted from the solder bump.

Also, in the package substrate according to the exemplary embodiments, the heat-diffusion prevention film prevents the metal post from being oxidized and displays an effect of improving a wetting property of the solder bump formed on the heat-diffusion prevention film.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims. Accordingly, such modifications, additions, and substitutions should also be understood to fall within the scope of the present invention.

What is claimed is:

1. A package substrate comprising:
a substrate including at least one conductive pad;
an insulation layer formed on the substrate and including an opening through which the conductive pad is exposed;
a blister prevention layer formed along a top surface of the conductive pad exposed through the opening and a sidewall of the insualtion layer;
a metal post made of an alloy material of tin (Sn) and copper (Cu) and formed on the blister prevention layer; and
a heat-diffusion prevention film formed on the metal post.

2. The package substrate according to claim 1, further comprising a solder bump formed on the heat-diffisuion prevention film.

3. The package substrate according to claim 1, wherein the blister prevention layer is formed higher than a top suface of the insulation layer on which the opening is formed, and is formed by electro copper plating using copper (Cu).

4. The package substrate according to claim 3, wherein the blister prevention layer is made of an alloy of copper (Cu) and tin (Sn) and a copper content of the blister prevention layer is 0.8 wt % to 5 wt %.

5. The package substrate according to claim 1, wherein the heat-diffusion prevention film is made of a metal material selected from the group consisting of Au—Ni, Au—Ni alloy, Ni, Ni alloy, Pd—Ni, Pd—Ni alloy, Au—Pd—Ni, and Au—Pd—Ni alloy.

6. A method for fabricating a package substrate, the method comprising:
preparing a substrate which includes at least one conductive pad;
forming an insulation layer on the substrate, the insulation layer including an opening through which the conductive pad is exposed;
forming a blister prevention layer along a top surface of the conductive pad exposed through the opening and a sidewall of the insulation layer;
forming a metal post made of an alloy material of tin (Sn) and copper (Cu) on the blister prevention layer by electro plating; and
forming a heat-diffusion prevention film on the metal post by electro or electroless plating.

7. The method according to claim 6, further comprising, after the forming of the heat-diffusion prevention film, forming a solder bump on the heat-diffusion prevention film.

8. The method according to claim 6, further comprising, before the forming of the blister prevention layer; forming a plating seed layer on the insulation layer; and
forming a dry film pattern on the plating seed layer.

9. The method according to claim 8, wherein the blister prevention layer is formed higher than a top surface of the insulation layer so as to block an interface between the dry film pattern and the plating seed layer.

10. The method according to claim 9, wherein the blister prevention layer is formed by electro plating using the plating seed layer as an electrode, and is made of an alloy material of tin (Sn) and copper (Cu) and a copper content of the blister prevention layer is 0.8 wt % to 5 wt %.

11. The method according to claim 6, wherein the heat-diffusion prevention film is made of a metal material selected from the group consisting of Au—Ni, Au—Ni alloy, Ni, Ni alloy, Pd—Ni, Pd—Ni alloy, Au—Pd—Ni, and Au—Pd—Ni alloy.

12. The method according to claim 8, further comprising, after the forming of the solder bump on the heat-diffusion prevention film,
removing the dry film pattern enclosing the metal post, the heat-diffusion prevention film, and the solder bump; and
removing the plating seed layer formed on a lower surface of the dry film pattern.

* * * * *